(12) United States Patent
Lee et al.

(10) Patent No.: US 8,723,545 B2
(45) Date of Patent: May 13, 2014

(54) PROBE CARD

(75) Inventors: Duk Kyu Lee, Uiwang-si (KR); Chang Min Im, Pyeongtaek-si (KR); Sang Bum Sim, Gwangju-si (KR); Yun Kee Cho, Namyangju-si (KR)

(73) Assignee: SDA Co., Ltd. (KR)

( * ) Notice: Subject to any disclaimer, the term of this patent is extended or adjusted under 35 U.S.C. 154(b) by 380 days.

(21) Appl. No.: 13/286,858

(22) Filed: Nov. 1, 2011

(65) Prior Publication Data

US 2012/0146677 A1 Jun. 14, 2012

(30) Foreign Application Priority Data

Dec. 8, 2010 (KR) .................. 10-2010-0124615

(51) Int. Cl.
*G01R 31/00* (2006.01)

(52) U.S. Cl.
USPC ............ 324/756.03; 324/756.04; 324/754.03; 324/756.07

(58) Field of Classification Search
CPC ........... G01R 1/07364; G01R 1/07371; G01R 1/07307; G01R 1/2889; G01R 1/2886
USPC ............. 324/755.01, 756.03–756.04, 754.07, 324/754.08
See application file for complete search history.

(56) References Cited

U.S. PATENT DOCUMENTS

| | | | |
|---|---|---|---|
| 6,292,003 B1 * | 9/2001 | Fredrickson et al. | 324/750.25 |
| 6,967,557 B2 * | 11/2005 | Hagios et al. | 336/200 |
| 2009/0291573 A1 * | 11/2009 | Eldridge et al. | 439/68 |
| 2010/0176831 A1 * | 7/2010 | Palcisko et al. | 324/757 |
| 2011/0095779 A1 * | 4/2011 | Washio et al. | 324/756.05 |
| 2011/0248735 A1 * | 10/2011 | Losey et al. | 324/754.11 |
| 2012/0146677 A1 * | 6/2012 | Lee et al. | 324/755.01 |

FOREIGN PATENT DOCUMENTS

KR 1020090027865 3/2009

* cited by examiner

*Primary Examiner* — Huy Q Phan
*Assistant Examiner* — Dustin Dickinson
(74) *Attorney, Agent, or Firm* — Berliner & Associates

(57) ABSTRACT

A probe card facilitates a wiring connection, reducing working time and preventing a working error and includes a main circuit board having an opening in its center. A reinforcement member has a lower end coupled to that opening to prevent deforming the board. A sub-circuit board electrically connected to the main board is seated on an upper side of the reinforcement member. A space transformer is positioned on a lower portion of the opening of the main board. A plurality of wires have both ends inserted into through holes in the sub-circuit board and space transformer to electrically connect them. Probes are provided on a lower portion of the space transformer, each having one end in contact with the wire inserted into the through-hole of the space transformer and the other end in contact with a wafer to be tested.

7 Claims, 3 Drawing Sheets

PROBE CARD

CROSS-REFERENCE TO RELATED APPLICATION

This application is based on and claims priority from Korean Patent Application No. 10-2010-0124615, filed on Dec. 8, 2010 in the Korean Intellectual Property Office, the disclosure of which is incorporated herein in its entirety by reference.

BACKGROUND OF THE INVENTION

1. Field of the Invention

The present invention relates to a probe card that adopts wirings in place of a multilayer ceramic substrate as a space transformer. More particularly, the present invention relates to a probe card, which is provided with a sub-circuit board for connecting a main circuit board and a space transformer to each other, and thus facilitates a wiring connection work to reduce a working time and to prevent a working error.

2. Description of the Prior Art

In general, a semiconductor device is manufactured through a fabrication process forming a pattern on a wafer and an assembly process assembling the patterned wafer into respective chips.

Between the fabrication process and the assembly process, a process so called an EDS (Electrical Die Sorting) testing electrical characteristics of respective chips, that is, semiconductor devices (DUT), that constitute a wafer is interposed, and this EDS process is performed to discriminate inferior semiconductor devices from semiconductor devices that constitute the wafer.

An electrical test of semiconductor devices that constitute a wafer is performed mainly using a test device that is called a probe card having plural probes which become in contact with the respective semiconductor devices to apply electrical signals thereto.

A typical probe card includes a main circuit board, a space transformer (STF), and probes fixedly attached to the space transformer. Here, as the space transformer, a multilayer ceramic (MLC) is mainly used.

On the other hand, if the wafer has a large area, it is required to manufacture a probe card of which the area is equal to or larger than a test area of the wafer. In this case, a space transformer having a large area is manufactured in the related art. However, since the MLC is expensive, it costs too much to manufacture the MLC having the large area.

In order to supplement this, as illustrated in FIG. 1, a wire type probe card that does not use the MLC, as the space transformer has been proposed. As illustrated in FIG. 1, such a probe card briefly includes a main circuit board 2, a space transformer 3 positioned on a lower portion of the main circuit board 2, and a wire unit 4 connecting the main circuit board 2 and the space transformer 3 with each other. In this case, both ends of the wire unit 4 are fixedly soldered to the main circuit board 2 and the space transformer 3, respectively, and the soldered wire unit 4 of the space transformer and the wafer are electrically connected by a pogo pin 5. This pogo pin 5 provided on both sides of the main circuit board 2 serves to connect the main circuit board 2 and semiconductor test equipment (not illustrated) positioned on an upper portion of the main circuit board 2 with each other.

However, since the wire unit 4 of the probe card, which is composed of a bunch of wires, is soldered to the space transformer 3, it is hard to connect the wires to the main circuit board 2 one by one, and it requires a lot of working time. Further, interference such as piling up of the wires may occur and a working error may be increased.

Further, since the wire unit 4 that connects the space transformer 3 and the main circuit board 2 with each other has a long length, a semiconductor testing speed is lowered.

SUMMARY OF THE INVENTION

Accordingly, the present invention has been made to solve the above-mentioned problems occurring in the related art while advantages achieved by the related art are maintained intact.

An embodiment of the present invention provides a probe card adopting a wire unit, which facilitates an electrical connection work of a main circuit board and a space transformer, reduces a working time, and prevents a working error.

In one aspect of the present invention, there is provided a probe card, which includes a main circuit board having an opening formed in the center thereof; a reinforcement member having a lower end that is coupled to the opening of the main circuit board to prevent deformation of the main circuit board; a sub-circuit board seated on an upper side of the reinforcement member, having a plurality of through-holes formed on the surface thereof, and electrically connected to the main circuit board; a space transformer mounted to position on a lower portion of the opening of the main circuit board and having a plurality of through-holes formed on the surface thereof; a plurality of wires having both ends inserted into the through-holes of the sub-circuit board and the space transformer to electrically connect the sub-circuit board and the space transformer with each other; and probes each having one end that is in contact with the wire inserted into the through-hole of the space transformer and the other hand that is in contact with a wafer to be tested, and provided on a lower portion of the space transformer.

The space transformer may have a surface area that is smaller than the sub-circuit board, and the sub-circuit board may include through-holes arranged in the same form as the through-holes of the space transformer.

The space transformer may be formed with a scale of 1 to X (here, o<X) of the sub-circuit board, and the sub-circuit board and the space transformer may have the same through-hole arrangement.

Insertion holes may be formed at both ends of the reinforcement member, and connection rods, each having a lower end that is in contact with the main circuit board and an upper end that is in contact with the sub-circuit, may be inserted into and coupled to the insertion holes of the reinforcement member, so that the main circuit board and the sub-circuit board are electrically connected to each other.

A space portion may be formed in a center portion of the reinforcement member, and epoxy resin may be filled in the space portion of the reinforcement member to fix the wires.

In another aspect of the present invention, there is provided a probe card, which includes a main circuit board having an opening formed in the center thereof; a reinforcement member having a lower end that is coupled to the opening of the main circuit board to prevent deformation of the main circuit board; a sub-circuit board including a first board portion positioned on an upper portion of the reinforcement member and having a plurality of through-holes formed on the surface thereof, and a second board portion horizontally extending from the first board portion to be fixed to the main circuit board, and having a plurality of through-holes formed on the surface thereof; a space transformer mounted to position on a lower portion of the opening of the main circuit board and having a plurality of through-holes formed on the surface thereof; a plurality of wires having both ends inserted into the through-holes of the first board portion of the sub-circuit board and the space transformer to electrically connect the sub-circuit board and the space transformer with each other; and probes each having one end that is in contact with the wire inserted into the through-hole of the space transformer and the other hand that is in contact with a wafer to be tested, and provided on a lower portion of the space transformer.

The probe card according to another aspect of the present invention may further include a plurality of conductive members each having one end soldered to the main circuit board and the other end inserted into and soldered to the through-hole formed on the second board portion of the sub-circuit board to electrically connect the main circuit board and the sub-circuit board with each other.

According to the probe card according to the aspects of the present invention, since a plurality of wires are applied to electrically connect the main circuit board and the space transformer, the cost can be reduced in comparison to the probe card in the related art in which the multilayer ceramic board is applied as the space transformer. Further, since the sub-circuit board for connecting the main circuit board and the space transformer with each other is provided, the probe card facilitates the wire connection work, reduces the working time, and prevents the occurrence of the interference between the wires. Further, since the through-holes, which are formed on the sub-circuit board and the space transformer, are in the same arrangement, even the occurrence of a working error is prevented.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, preferred embodiments of the present invention will be described with reference to the accompanying drawings. The matters defined in the description, such as the detailed construction and elements, are nothing but specific details provided to assist those of ordinary skill in the art in a comprehensive understanding of the invention, and thus the present invention is not limited thereto.

Figure 1:
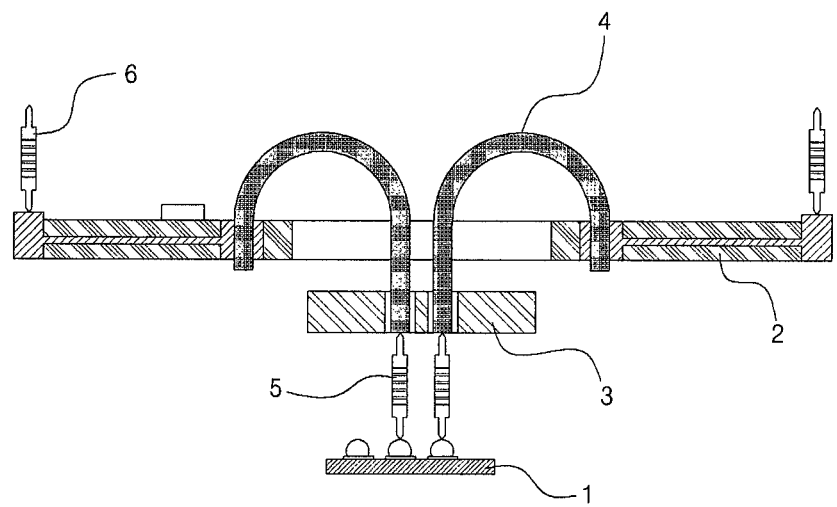
FIG. 1 is a conceptual view illustrating a probe card in the related art.
Figure 2:
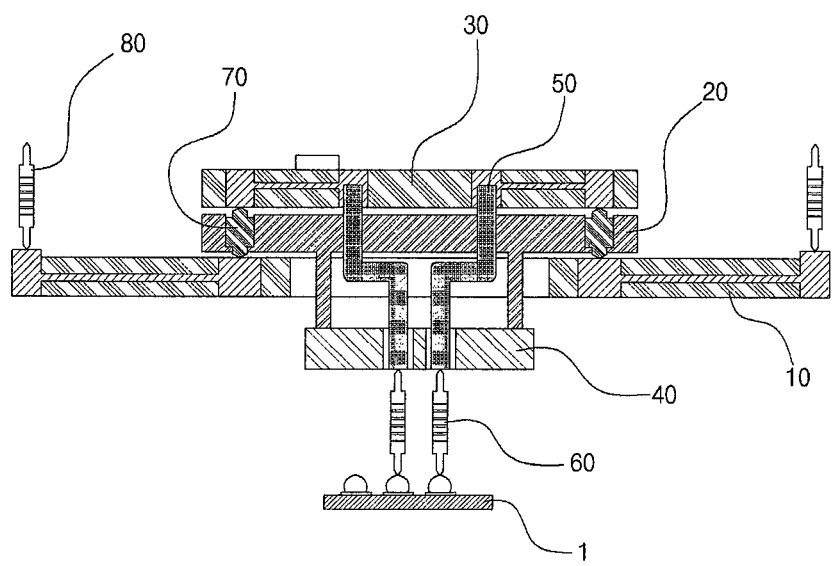
FIG. 2 is a conceptual view illustrating a probe card according to an embodiment of the present invention.

With reference to FIG. 2, a probe card according to an embodiment of the present invention will be described. As illustrated, the probe card includes a main circuit board 10, a reinforcement member 20, a sub-circuit board 30, a space transformer 40, a plurality of wires 50, and probes 60. The probe card may further include connection rods 70.

The main circuit board 10 has an opening (no drawing reference numeral) formed in the center thereof to be coupled to the reinforcement member 20.

The reinforcement member 20 serves to prevent deformation of the main circuit board 10, and a lower end thereof is coupled to the opening of the main circuit board 10. Further, an upper end of the reinforcement member 20 is positioned on an upper portion of the opening of the main circuit board 10, and specifically, is seated on an outer side of the opening of the main circuit board 10. In the center of the reinforcement member 20, through-holes, which have the size and arrangement corresponding to those of through-holes formed on the space transformer 40 to be described later, may be formed.

The sub-circuit board 30 is seated on an upper side of the reinforcement member 20, and a plurality of through-holes (no drawing reference numeral), into which the plurality of wires 50 can be inserted, are formed on the surface of the sub-circuit board 30. Further, the sub-circuit board 30 is electrically connected to the main circuit board 10.

Here, in order to electrically connect the sub-circuit board 30 and the main circuit board 10 with each other, insertion holes (no drawing reference numeral) are formed at both ends of the reinforcement member 20, and the connecting rods 70 are inserted into and coupled to the insertion holes of the reinforcement member 20. In this case, the lower end of the connection rod 70 is in contact with the main circuit board 10, and the upper end thereof is in contact with the sub-circuit board 30 to electrically connect the main circuit board 10 and the sub-circuit board 30 with each other.

The space transformer (STF) 40 is mounted to position on the lower portion of the main circuit board 10. Since the present invention is to solve the problem of the high cost due to the large area in the case of using the multilayer ceramic board as the space transformer in the related art, the space transformer 40 has a small surface area and has a plurality of through-holes (no drawing reference numeral) formed on the surface thereof, into which the plurality of wires 50 are to be inserted.

It is preferable that such through-holes of the space transformer 40 are arranged in the same form as the through-holes of the sub-circuit board 30. This is to prevent the occurrence of a working error and to easily correct the error when the wires 50 connected to the space transformer 40 are inserted into and soldering to the through-holes of the sub-circuit board 30.

In other words, since the plurality of through-holes of the space transformer 40 and the sub-circuit board 30 are arranged in the same form, one wire strip that is connected to the space transformer 40 can be inserted into the through-hole of the sub-circuit board 30 having the same row and column, and in this case, no interference occurs between several wire strips. Even if an error occurs, the error can be easily corrected by picking out a strip of the wires 50 from the sub-circuit board 30 and inserting the strip into the through-hole of the sub-circuit board 30 that corresponds to the same row and column.

Further, as described above, if the space transformer 40 has a small surface area and the through-holes thereof are arranged in the same form as the through-holes of the sub-circuit board 30, the space transformer 40 may be formed with a scale of 1 to X (here, o<X) of the sub-circuit board 30.

However, the number and the arrangement form of through-holes of the space transformer 40 may not be the same as those of the sub-circuit board 30 due to spatial limitations. In this case, it is sufficient if the sub-circuit board 30 includes through-holes that are arranged in the same form as the through-holes of the space transformer 40.

Further, the wires 50 are fixed by filling epoxy resin in the space portion 22 that is formed in the reinforcement member 20, and the wire portions that have passed through the through-holes of the space transformer 40 are cut and then sanded for the finish. The reason why the sanding process is performed is to make the wire portions form the same plane without being exposed from the bottom surface of the space transformer 40.

Further, in the case of fixing the wires 50 to the sub-circuit board 30, the strips of the wires 50 are made to pass through the through-holes of the sub-circuit board 30, and the wires that are exposed to the upper side of the sub-circuit board 30 are cut and then soldered.

The probe 60 serves to electrically connect the wafer 1 to be tested to the space transformer 40. That is, one end of the probe 60 is in contact with the wire 50 connected to the space transformer 40, and the other end of the probe 60 is in contact with the wafer 1 that is positioned on the lower side thereof for testing. For reference, in the present invention, the probe 60 is not specially limited, and diverse examples may be adopted, for example, pogo pins or the like may be adopted.

The unexplained drawing reference numeral 80 denotes a pogo pin for electrically connecting the main circuit board 10 and the semiconductor test equipment (not illustrated) with each other.

Figure 3:
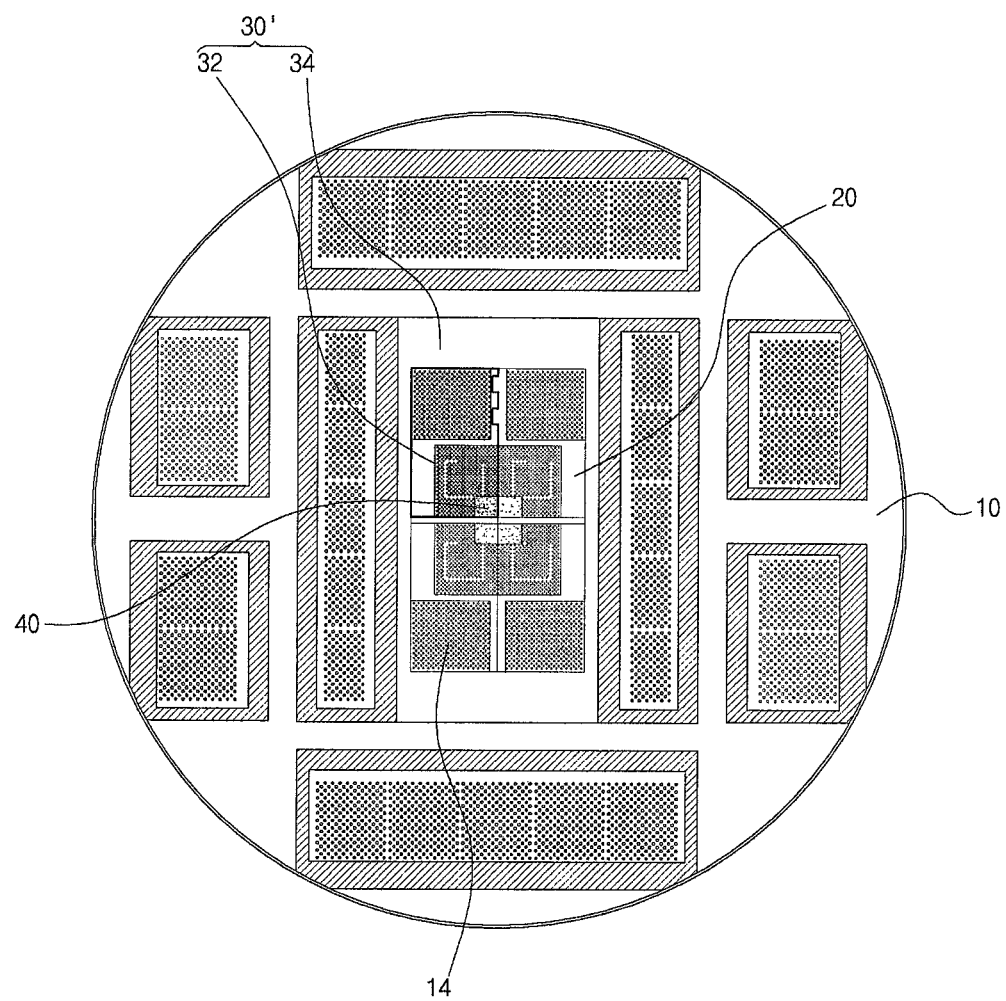
FIG. 3 is a schematic plan view illustrating a probe card according to another embodiment of the present invention.
Figure 4:
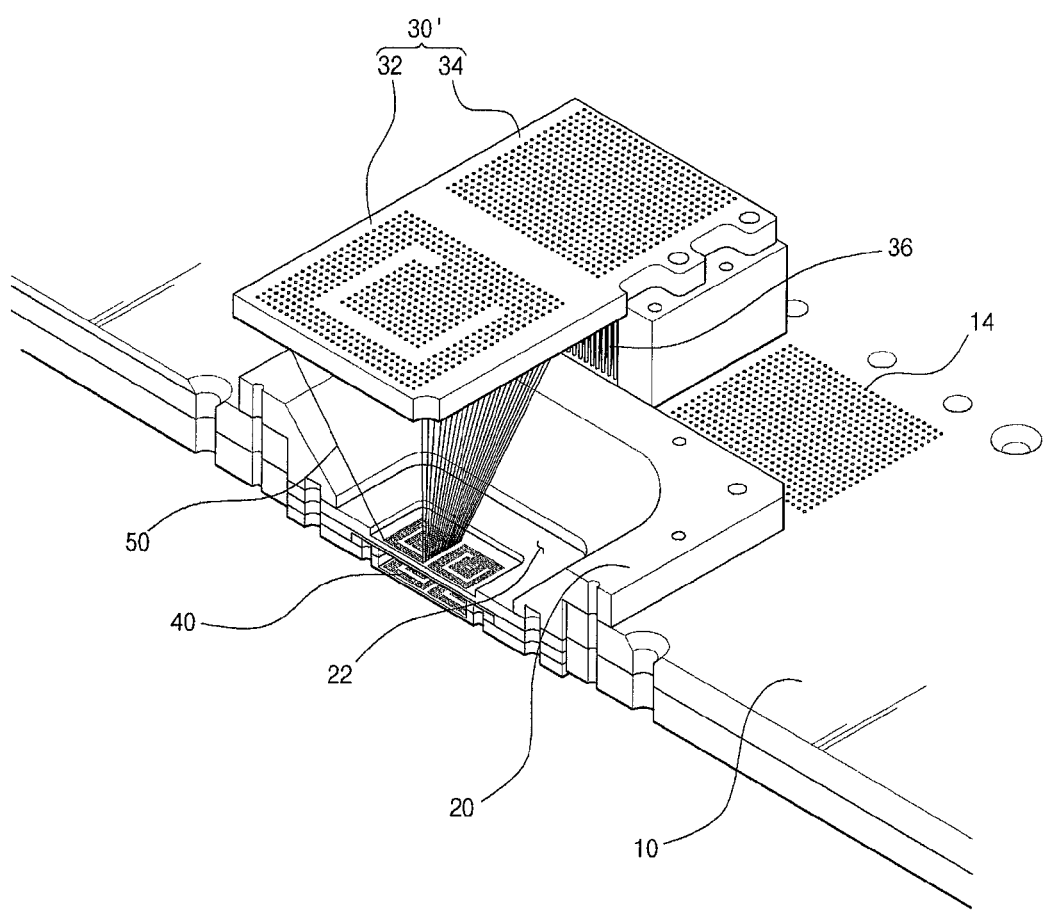
FIG. 4 is an exploded perspective view illustrating a main part of the probe card illustrated in FIG. 3.

In FIGS. 3 and 4, a probe card according to another embodiment of the present invention is illustrated. As illustrated, the probe card includes a main circuit board 10, a reinforcement member 20, a sub-circuit board 30', a space transformer 40, and a plurality of wires 50. Although not illustrated, the probe card according to another embodiment of the present invention may further include probes for being in contact with the waver to be tested that is on the lower side of the space transformer 40.

The main circuit board 10 is in a substantially circular plate shape. In the center portion of the main circuit board 10, an opening (no drawing reference numeral) for being coupled to the reinforcement member 20 is formed.

The reinforcement member 20 has a lower end that is coupled to the opening of the main circuit board 10, and serves to prevent deformation of the main circuit board 10. The reinforcement member 20 has an upper end that is positioned on an outer side of the opening of the main circuit board 10, and is formed to be inclined inwardly, starting from the upper end to the lower end thereof. Further, in the center portion of the reinforcement member 20, a space portion 22 for filling epoxy resin is provided. Further, on the surface of the lower side of the space portion 22 of the reinforcement member 20, a plurality of through-holes (no drawing reference numeral) are formed to correspond to the through-holes formed on the space transformer 40 to be described later.

The sub-circuit board 30' includes a first board portion 32 and a second board portion 34. The second board portion 34 has one side that is fixed to the main circuit board 10, and has a plurality of through-holes (no drawing reference numeral) formed on the surface thereof. The first board portion 32 extends horizontally from the second board portion 34, and is positioned on the upper portion of the reinforcement member 20. On the other hand, a plurality of sub-circuit boards 30' may be provided, and FIG. 3 illustrates that four sub-circuit boards 30' are provided.

The space transformer 40 is coupled to the lower end of the reinforcement member 20 so that it is positioned on the lower portion of the opening of the main circuit board 10. Further, the space transformer 40 has a plurality of through-holes (no drawing reference numeral) into which the wires 50 are inserted. Further, a plurality of space transformers 40 may be provided to correspond to the number of sub-circuit boards 30'.

On the other hand, the number and the arrangement form of the through-holes formed on the first board portion 32 of the sub-circuit board 30' may be the same as those of the through-holes of the space transformer 40, and in this case, the space transformer 40 may be formed with a scale of 1 to X (here, 0<X) of the first board portion 32 of the sub-circuit board 30'.

However, in the case where the through-holes of the space transformer 40 is unable to be formed to correspond to the number and the arrangement form of the through-holes of the sub-circuit board 30', it is sufficient if the first board portion 32 of the sub-circuit board 30' includes through-holes that are arranged in the same form as the through-holes of the space transformer 40.

The wires 50 has one end that is inserted into the space transformer 40 positioned on the lower portion of the reinforcement member 20 and the other end that is inserted into and soldered to the through-holes formed on the first board portion 32 of the sub-circuit board 30', and electrically connects the space transformer 40 and the sub-circuit board 30' with each other. In the case of fixing the wires 50 to the first board portion 32 of the sub-circuit board 30', the wires 50 that have passed through the through-holes of the first board portion 32 are cut and then soldered. Further, the wires 50 are positioned on the space portion of the reinforcement member 20, and are completely fixed through filling epoxy resin in the space portion 22 of the reinforcement member 20. Further, in the case of the wires inserted into the space transformer 40, the wire portions that have passed through the through-holes of the space transformer 40 are cut and then sanded for the finish as described above. For convenience, only a part of the wires 50 is illustrated in FIG. 4.

The sub-circuit board 30' is electrically connected to the main circuit board 10 as the second board portion 34 is connected to the main circuit board 10. That is, as illustrated in FIG. 4, the second board portion 34 is connected to the connection portion 14 of the main circuit board 10 through a conductive member 36, and by this, the space transformer 40 and the main circuit board 10 are electrically connected with each other. Both ends of the conductive member 36, which is made of a metal material, are soldered to the second board portion 34 of the sub-circuit board 30' and the main circuit board 10.

Since other technical features are the same as those of the probe card illustrated in FIG. 2 as described above, more detailed description thereof will be omitted.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A probe card comprising:
a main circuit board having an opening formed in the center thereof;
a reinforcement member having a lower end that is coupled to the opening of the main circuit board to prevent deformation of the main circuit board;
a sub-circuit board seated on an upper side of the reinforcement member, having a plurality of through-holes formed on the surface thereof, and electrically connected to the main circuit board;
a space transformer mounted to position on a lower portion of the opening of the main circuit board and having a plurality of through-holes formed on the surface thereof;
a plurality of wires having both ends inserted into the through-holes of the sub-circuit board and the space transformer to electrically connect the sub-circuit board and the space transformer with each other; and probes each having one end that is in contact with the wire inserted into the through-hole of the space transformer and the other hand that is in contact with a wafer to be tested, and provided on a lower portion of the space transformer.

2. The probe card according to claim 1, wherein the space transformer has a surface area that is smaller than the sub-circuit board, and the sub-circuit board includes through-holes arranged in the same form as the through-holes of the space transformer.

3. The probe card according to claim 1, wherein the space transformer is formed with a scale of 1 to X (here, o<X) of the sub-circuit board, and the sub-circuit board and the space transformer have the same through-hole arrangement.

4. The probe card according to claim 1, wherein insertion holes are formed at both ends of the reinforcement member, and connection rods, each having a lower end that is in contact with the main circuit board and an upper end that is in contact with the sub-circuit, are inserted into and coupled to the insertion holes of the reinforcement member, so that the main circuit board and the sub-circuit board are electrically connected with each other.

5. The probe card according to claim 1, wherein a space portion is formed in a center portion of the reinforcement member, and epoxy resin is filled in the space portion of the reinforcement member to fix the wires.

6. A probe card comprising:
a main circuit board having an opening formed in the center thereof;
a reinforcement member having a lower end that is coupled to the opening of the main circuit board to prevent deformation of the main circuit board;
a sub-circuit board including a first board portion positioned on an upper portion of the reinforcement member and having a plurality of through-holes formed on the surface thereof, and a second board portion horizontally extending from the first board portion to be fixed to the main circuit board, and having a plurality of through-holes formed on the surface thereof;
a space transformer mounted to position on a lower portion of the opening of the main circuit board and having a plurality of through-holes formed on the surface thereof;
a plurality of wires having both ends inserted into the through-holes of the first board portion of the sub-circuit board and the space transformer to electrically connect the sub-circuit board and the space transformer with each other; and
probes each having one end that is in contact with the wire inserted into the through-hole of the space transformer and the other hand that is in contact with a wafer to be tested, and provided on a lower portion of the space transformer.

7. The probe card according to claim 6, further comprising a plurality of conductive members each having one end soldered to the main circuit board and the other end inserted into and soldered to the through-hole formed on the second board portion of the sub-circuit board to electrically connect the main circuit board and the sub-circuit board with each other.

* * * * *